(12) United States Patent
Tokuda et al.

(10) Patent No.: US 11,894,597 B2
(45) Date of Patent: Feb. 6, 2024

(54) DIRECTIONAL COUPLER AND ELECTRONIC COMPONENT MODULE

(71) Applicant: Murata Manufacturing Co., Ltd., Kyoto (JP)

(72) Inventors: Daisuke Tokuda, Kyoto (JP); Yasushi Shigeno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 468 days.

(21) Appl. No.: 17/028,320

(22) Filed: Sep. 22, 2020

(65) Prior Publication Data

US 2021/0098854 A1    Apr. 1, 2021

(30) Foreign Application Priority Data

Sep. 27, 2019   (JP) ................... 2019-176322

(51) Int. Cl.
*H01P 5/18*      (2006.01)
*H05K 1/02*      (2006.01)
*H01P 3/08*      (2006.01)

(52) U.S. Cl.
CPC ............... *H01P 5/18* (2013.01); *H01P 3/08* (2013.01); *H05K 1/0243* (2013.01)

(58) Field of Classification Search
CPC .. H05K 1/0243; H05K 1/0237; H05K 1/0239; H05K 2201/0379; H05K 2201/09236; H05K 2201/09218; H05K 2201/09227; H01P 3/003; H01P 3/02; H01P 3/08; H01P 3/081; H01P 3/082; H01P 5/028; H01P 5/12; H01P 5/16; H01P 5/18
See application file for complete search history.

(56) References Cited

U.S. PATENT DOCUMENTS

| | | |
|---|---|---|
| 10,498,004 B1 | 12/2019 | Ji et al. |
| 2003/0076191 A1* | 4/2003 | Lida ................. H01P 5/185 333/116 |
| 2011/0001575 A1 | 1/2011 | Aporte et al. |
| 2012/0077449 A1* | 3/2012 | Ohashi ............... H04B 1/036 455/114.3 |
| 2013/0194055 A1* | 8/2013 | Mitake .............. H01P 5/184 333/116 |
| 2015/0311577 A1 | 10/2015 | Yamatogi et al. |
| 2016/0268668 A1* | 9/2016 | Mitake .............. H01P 5/184 |
| 2018/0062237 A1* | 3/2018 | Oohashi ............ H01P 5/185 |
| 2022/0077560 A1* | 3/2022 | Seki ................. H01P 5/188 |
| 2022/0181766 A1* | 6/2022 | Mori ................. H01Q 13/10 |

FOREIGN PATENT DOCUMENTS

| | | |
|---|---|---|
| CN | 105048050 A | 11/2015 |
| JP | H08-116203 A | 5/1996 |
| JP | H08-307116 A | 11/1996 |
| JP | 2861228 B2 | 2/1999 |
| JP | 2011-19215 A | 1/2011 |
| JP | 2016-171398 A | 9/2016 |

* cited by examiner

*Primary Examiner* — Hoa C Nguyen
*Assistant Examiner* — John B Freal
(74) *Attorney, Agent, or Firm* — Pearne & Gordon LLP

(57) ABSTRACT

A directional coupler includes a substrate, a main line 121, a main line 122, and a sub-line. The main line 121 and the main line 122 each include a conductor pattern formed in the substrate, and are connected in parallel to each other. The sub-line includes a conductor pattern formed in the substrate. The sub-line is disposed at a position at least partially overlapping with the main line 121 in a plan view of the substrate.

17 Claims, 7 Drawing Sheets

DIRECTIONAL COUPLER AND ELECTRONIC COMPONENT MODULE

CROSS REFERENCE TO RELATED APPLICATION

This application claims priority from Japanese Patent Application No. 2019-176322 filed on Sep. 27, 2019. The content of this application is incorporated herein by reference in its entirety.

BACKGROUND OF THE DISCLOSURE

Field of the Disclosure

The present disclosure relates to a directional coupler in which a main line and a sub-line are formed in a substrate, and an electronic component module including the stated directional coupler.

Description of the Related Art

Japanese Unexamined Patent Application Publication No. 8-116203 and Japanese Unexamined Patent Application Publication No. 2016-171398 disclose directional couplers. The directional couplers disclosed in Japanese Unexamined Patent Application Publication No. 8-116203 and Japanese Unexamined Patent Application Publication No. 2016-171398 each include a dielectric substrate, and a main line and a sub-line constituted of conductor patterns. The main line and the sub-line are disposed in the same layer of the substrate.

However, in the directional couplers described in Japanese Unexamined Patent Application Publication No. 8-116203 and Japanese Unexamined Patent Application Publication No. 2016-171398, it is difficult to increase the degree of coupling between the main line and the sub-line without increasing the size of the overall shape. For example, in the directional couplers described in Japanese Unexamined Patent Application Publication No. 8-116203 and Japanese Unexamined Patent Application Publication No. 2016-171398, in order to obtain a desired (large) degree of coupling, a portion that contributes to the coupling in the main line and the sub-line needs to be lengthened, which increases the size of the substrate.

BRIEF SUMMARY OF THE DISCLOSURE

Accordingly, an object of the present disclosure is to provide a directional coupler likely to obtain a large degree of coupling while suppressing an increase in size of the shape.

A directional coupler according to preferred embodiments of the present disclosure includes a substrate, a first main line, a second main line, and a first sub-line. The substrate has a first principal surface and a second principal surface opposing each other. The first main line and the second main line each include a conductor pattern formed in the substrate, and are connected in parallel to each other. The first sub-line includes a conductor pattern formed in the substrate. The first sub-line is disposed at a position at least partially overlapping with the first main line.

In this configuration, the first main line and the first sub-line are disposed in such a manner that principal surfaces of the conductor patterns face each other. An area of the principal surface of the conductor pattern is typically larger than an area of a side surface thereof. Because of this, electric field coupling between the first main line and the first sub-line is increased in strength, so that the degree of coupling is improved.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

First Embodiment

Figure 1A:
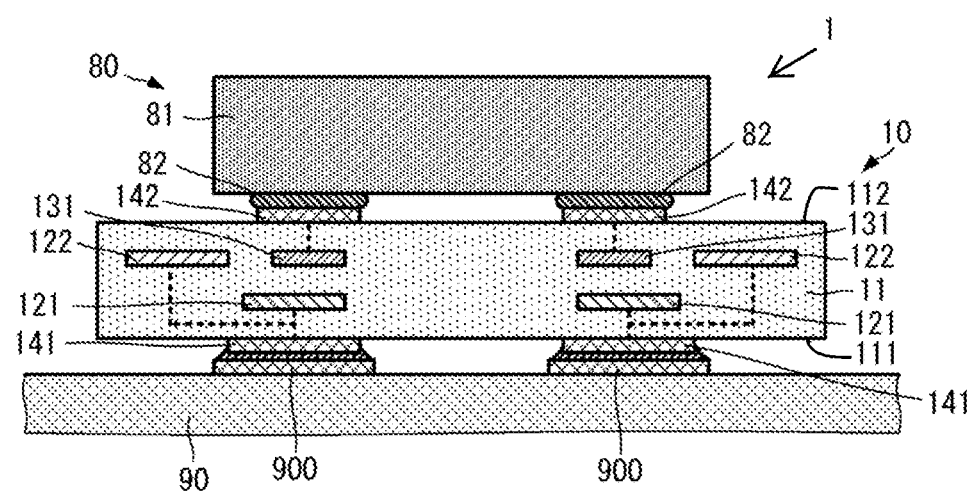
FIG. 1A is a schematic cross-sectional side view illustrating a configuration of an electronic component module according to a first embodiment.
Figure 1B:
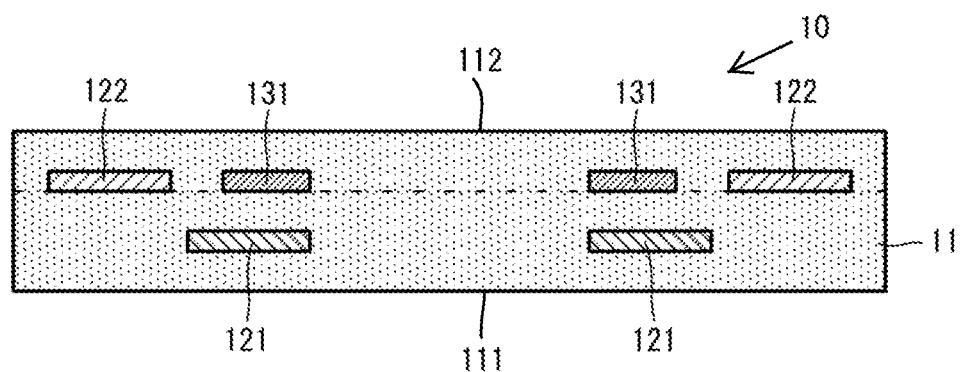
FIG. 1B is a schematic cross-sectional side view illustrating a major configuration of a directional coupler according to the first embodiment.
Figure 2:
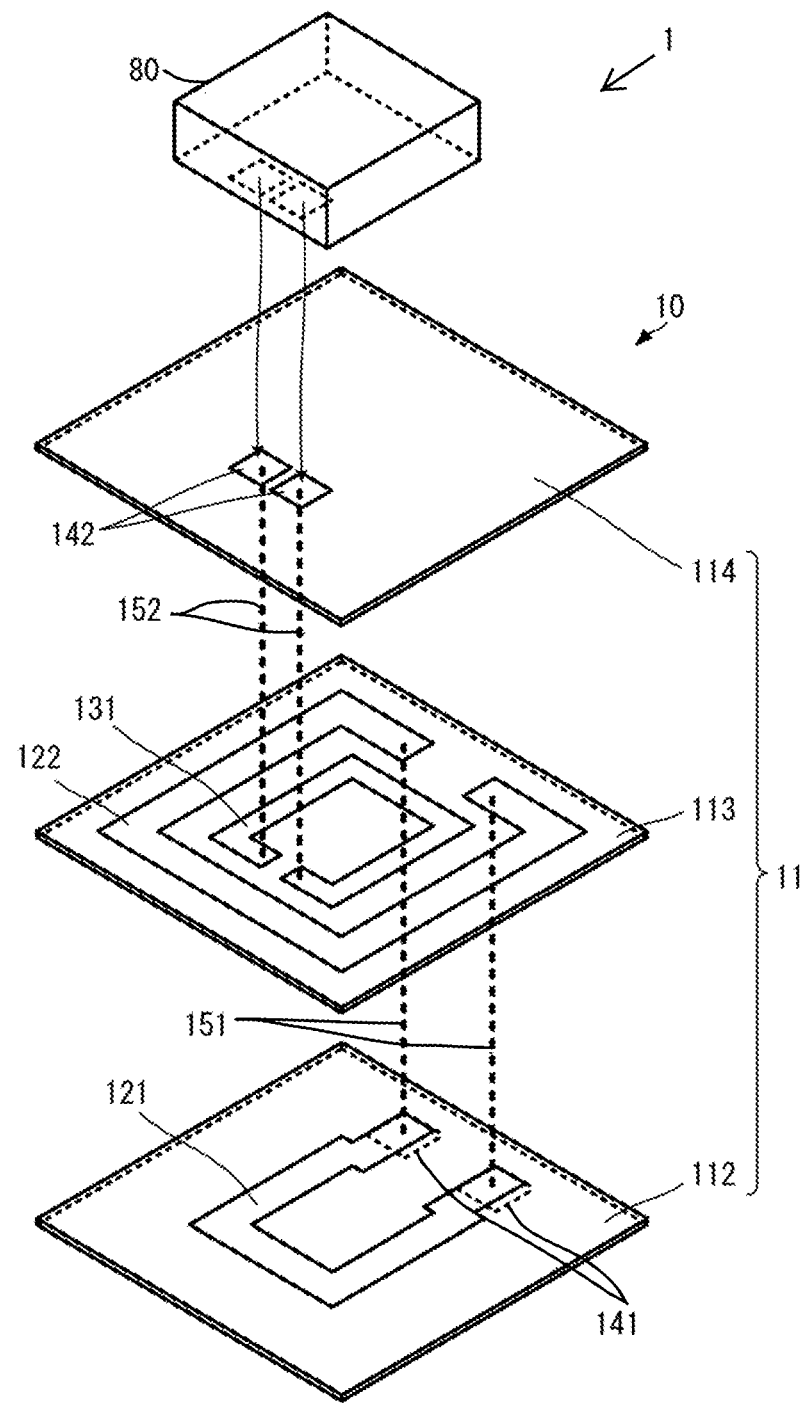
FIG. 2 is an exploded perspective view illustrating a configuration of an electronic component module according to the first embodiment.

A directional coupler and an electronic component module according to a first embodiment of the present disclosure will be described with reference to the drawings. FIG. 1A is a schematic cross-sectional side view illustrating a configuration of an electronic component module according to the first embodiment, and FIG. 1B is a schematic cross-sectional side view illustrating a major configuration of a directional coupler according to the first embodiment. FIG. 2 is an exploded perspective view illustrating a configuration of an electronic component module according to the first embodiment. In FIGS. 1A, 1B, and 2, the dimensions are emphasized as appropriate for easy understanding of the configuration.

Structure of Directional Coupler 10

As illustrated in FIGS. 1A, 1B, and 2, a directional coupler 10 includes a substrate 11, a main line 121, a main line 122, a sub-line 131, an external terminal conductor 141, and a land conductor 142. The main line 121 corresponds to a "first main line" of the present disclosure, and the main line 122 corresponds to a "second main line" of the present disclosure. The sub-line 131 corresponds to a "first sub-line" of the present disclosure.

The substrate 11 is formed in a flat plate shape using an insulative material as a base material. The substrate 11 has a first principal surface 111 and a second principal surface 112, which are orthogonal to a thickness direction of the flat plate shape and oppose each other. The substrate 11 is achieved by using, for example, an insulative resin, a semiconductor substrate, a low-temperature firing ceramic substrate (LTCC) or the like.

The main line 121, the main line 122, and the sub-line 131 are each formed of a linear or strip-shaped conductor pattern. The external terminal conductor 141 and the land conductor 142 are each formed of, for example, a substantially rectangular conductor pattern. Note that the "conductor pattern" referred to herein also includes a conductor pattern (an interlayer connection conductor or the like) that extends in a thickness direction of the substrate 11, in addition to a conductor pattern that is formed in the substrate 11 and is parallel to the first principal surface 111 and the second principal surface 112 of the substrate 11.

The main line 121 and the main line 122 are connected in parallel to each other. The main line 121 and the main line 122 are connected to the external terminal conductor 141. The sub-line 131 is connected to the land conductor 142.

The sub-line 131 is electromagnetically coupled with each of the main line 121 and the main line 122. At this time, a length of a coupling portion contributing as a directional coupler (a portion that generates major electromagnetic field coupling) in the sub-line 131 and the main lines 121 and 122, is determined by a wave length of a high frequency signal to be detected that is transmitted to the main lines 121 and 122, the required coupling strength, and the like.

More specific positional relationships among the main line 121, the main line 122, and the sub-line 131 are as follows.

The main line 121 and the main line 122 are disposed at different positions in the thickness direction of the substrate 11. The main line 121 and the main line 122 are disposed at different positions when viewed in the thickness direction orthogonal to the first principal surface 111 and second principal surface 112 of the substrate 11, in other words, in a plan view of the substrate 11. The expression "the main line 121 and the main line 122 are disposed at different positions in the thickness direction" means that, when the substrate 11 is a multilayer substrate formed by laminating a plurality of layers, the main line 121 and the main line 122 are formed in different layers from each other among the plurality of layers.

The sub-line 131 overlaps with the main line 121 in a plan view. The sub-line 131 is disposed at the same position as the main line 122 in the thickness direction. Here, the expression "the sub-line 131 is disposed at the same position as the main line 122 in the thickness direction" means that, for example, when the substrate 11 is a multilayer substrate formed by laminating a plurality of layers, the sub-line 131 and the main line 122 are formed in the same layer among the plurality of layers. Therefore, the above-described expression also includes a case where the position in the thickness direction of the sub-line 131 and the position in the thickness direction of the main line 122 are not exactly the same, and a variation in positions thereof exists to some extent.

At least part of the sub-line 131 extends parallel with a predetermined length to the main line 121 and the main line 122. A case in which the lines extend parallel to each other includes not only a case in which the lines are parallel to each other but also a case in which the lines are substantially parallel to each other (for example, an angle between the lines is 180°±10°).

With such configuration, the main line 121 and the sub-line 131 are disposed so that the principal surfaces thereof face each other. Here, the conductor patterns forming the main line 121 and the sub-line 131 tend to have a large width as compared to the height. That is, an area of the principal surface of the main line 121 (the surface disposed in the thickness direction of the substrate 11 in the main line 121 (the surface substantially parallel to the first principal surface 111 and the second principal surface 112 of the substrate 11)) is larger than an area of a side surface of the main line 121 (the surface disposed in a direction orthogonal to the thickness direction of the substrate 11 in the main line 121 (the surface substantially orthogonal to the first principal surface 111 and the second principal surface 112 of the substrate 11)).

Likewise, an area of the principal surface of the sub-line 131 (the surface disposed in the thickness direction of the substrate 11 in the sub-line 131 (the surface substantially parallel to the first principal surface 111 and the second principal surface 112 of the substrate 11)) is larger than an area of a side surface of the sub-line 131 (the surface disposed in a direction orthogonal to the thickness direction of the substrate 11 in the sub-line 131 (the surface substantially orthogonal to the first principal surface 111 and the second principal surface 112 of the substrate 11)). Therefore, the main line 121 and the sub-line 131 are likely to obtain larger electric field coupling (capacitive coupling) than in an existing configuration in which the lines are disposed in such a manner that the side surfaces thereof face each other at the same position in the thickness direction.

Further, the main line 121 and the sub-line 131 are disposed comparatively close to each other. For example, the main line 121 and the sub-line 131 are disposed at a distance of about the thickness of a dielectric layer forming the substrate 11 (for example, about 15 μm to about 50 μm). With this, the main line 121 and the sub-line 131 may obtain large magnetic field coupling (inductive coupling).

As a result, the directional coupler 10 is able to obtain large electromagnetic field coupling without making the main line 121 and the sub-line 131 longer than in the existing configuration. That is, the directional coupler 10 is likely to obtain a large degree of coupling while suppressing an increase in size.

Conversely, the shape of the directional coupler 10 may be reduced for obtaining the same degree of coupling as that in the existing configuration. In other words, the size of the directional coupler 10 may be reduced while obtaining the same degree of coupling as that in the existing configuration.

The main line 122 and the sub-line 131 are disposed at the same position in the thickness direction of the substrate 11, and are also disposed close to each other. For example, the main line 122 and the sub-line 131 are disposed at an interval of about 15 μm to about 50 μm. The interval may be further shortened depending on the formation accuracy of the conductor pattern or the like, and may be appropriately adjusted as well. With this configuration, the main line 122 and the sub-line 131 are electromagnetically coupled to each other.

Because of this, a high frequency signal for detection, which is obtained by the electromagnetic field coupling with respect to each of the main line 121 and the main line 122 connected in parallel, flows through the sub-line 131. As a result, the high frequency signal for detection flowing through the sub-line 131 becomes large in magnitude, and the electromagnetic field coupling may be substantially further increased in strength. Accordingly, the directional coupler 10 may obtain a larger degree of coupling than that in the existing configuration while further suppressing the increase in size.

In addition, in this configuration, there is no portion where the main line 121 and the main line 122 overlap with each other. This makes it possible to reduce a deviation in distribution of the current flowing through the main line 121 and the main line 122. Therefore, it is possible for the directional coupler 10 to decrease equivalent series resistance in the coupling portion, and decrease insertion loss IL.

In addition, in this configuration, the main line 121 and the main line 122 are connected in parallel to each other. With this, the width of the main line in the coupling portion is substantially increased. Accordingly, it is possible for the directional coupler 10 to decrease the insertion loss IL.

Specific Achievement Example of Structure of Directional Coupler

The directional coupler 10 having the above-described configuration may be achieved by, for example, a configuration as illustrated in FIG. 2.

The substrate 11 includes a dielectric layer 112, a dielectric layer 113, and a dielectric layer 114. The dielectric layer 112, the dielectric layer 113, and the dielectric layer 114 are laminated in this order.

The main line 121 is disposed on a surface on the dielectric layer 113 side in the dielectric layer 112. The main line 121 is, for example, an annular conductor pattern with a part thereof being cut out.

The main line 122 and the sub-line 131 are disposed on a surface being in contact with the dielectric layer 114 in the dielectric layer 113. Each of the main line 122 and the sub-line 131 is, for example, an annular conductor pattern with a part thereof being cut out.

The conductor pattern constituting the main line 122 and the conductor pattern constituting the sub-line 131 extend partially parallel to each other along a direction in which the respective conductor patterns extend. The degree of coupling between the main line 122 and the sub-line 131 is adjusted by the distance in which the conductor patterns extend in parallel.

The conductor pattern constituting the sub-line 131 partially overlaps the conductor pattern constituting the main line 121 in a plan view. The conductor pattern constituting the main line 121 and the conductor pattern constituting the sub-line 131 extend partially parallel to each other along a direction in which the respective conductor patterns extend. The degree of coupling between the main line 121 and the sub-line 131 is adjusted by the overlapping area and the distance in which the conductor patterns extend in parallel.

Since the directional coupler 10 is formed by, as described above, laminating the dielectric layers in which the conductor patterns constituting the main line 121, the main line 122, and the sub-line 131 are respectively formed, the directional coupler 10 may be manufactured by a simple manufacturing method. Further, since the main line 121, the main line 122, and the sub-line 131 are achieved by the conductor patterns respectively disposed (formed) in the dielectric layers, it is possible to adjust the shapes (the shapes of the conductor patterns and the thicknesses of the dielectric layers), and it is easy for the directional coupler 10 to achieve a structure able to obtain a desired degree of coupling.

Furthermore, the directional coupler 10 has the following configuration.

The external terminal conductor 141 is disposed on a surface on the opposite side to the surface being in contact with the dielectric layer 113 in the dielectric layer 112. In other words, the external terminal conductor 141 is disposed on the first principal surface 111 of the substrate 11 (see FIG. 1A).

The external terminal conductor 141 is, for example, a substantially rectangular conductor pattern. The external terminal conductor 141 overlaps with an end portion of the conductor pattern constituting the main line 121 and an end portion of the conductor pattern constituting the main line 122 in a plan view. The external terminal conductor 141 is connected to the main line 121 and the main line 122 via an interlayer connection conductor 151, which extends in the thickness direction of the substrate 11.

The land conductor 142 is disposed on a surface on the opposite side to the surface being in contact with the dielectric layer 113 in the dielectric layer 114. In other words, the land conductor 142 is disposed on the second principal surface 112 of the substrate 11 (see FIG. 1A).

The land conductor 142 is, for example, a substantially rectangular conductor pattern. The land conductor 142 overlaps with an end portion of the conductor pattern constituting the sub-line 131 in a plan view. The land conductor 142 is connected to the sub-line 131 via an interlayer connection conductor 152, which extends in the thickness direction of the substrate 11.

Note that the configuration illustrated in FIGS. 1A and 1B is merely an example. The number of layers of the dielectric layers and the formation positions of the conductor patterns in the directional coupler 10 may take another configuration as long as the configuration maintains the above-described positional relationships among the main line 121, the main line 122, and the sub-line 132.

Circuit Configuration Example of Directional Coupler 10

Figure 3:
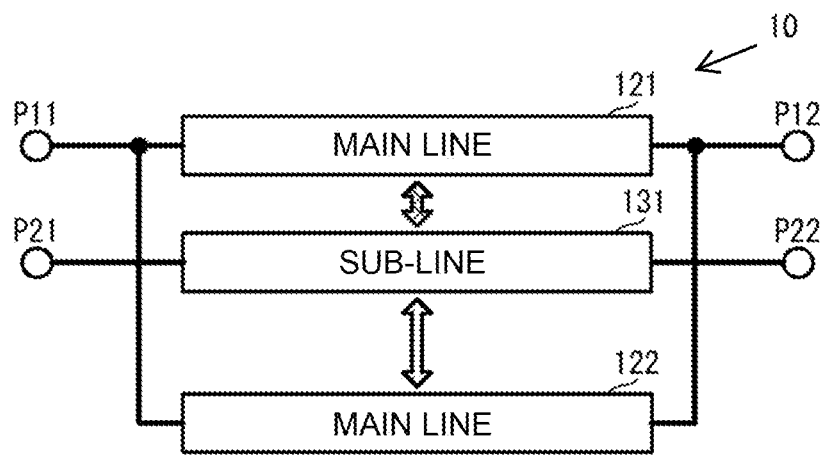
FIG. 3 is an equivalent circuit diagram of a directional coupler according to the first embodiment.

With such configuration, the directional coupler 10 achieves a circuit illustrated in FIG. 3. FIG. 3 is an equivalent circuit diagram of the directional coupler according to the first embodiment.

As illustrated in FIG. 3, the directional coupler 10 includes an RF terminal P11, an RF terminal P12, a detection terminal P21, and a detection terminal P22. A parallel circuit formed of the main line 121 and the main line 122 is connected between the RF terminal P11 and the RF terminal P12. The sub-line 131 is connected between the detection terminal P21 and the detection terminal P22.

The sub-line 131 and the main lines 121, 122 are electromagnetically coupled to one another. With this configuration, the directional coupler 10 receives a high frequency signal to be detected from the RF terminal P11, and outputs the high frequency signal to be detected from the RF terminal P12, for example. Further, the directional coupler 10 outputs, from the detection terminal P22, a high frequency signal (input measurement signal) excited by the high frequency signal inputted from the RF terminal P11, and outputs, from the detection terminal P21, a high frequency signal (reflection measurement signal) excited by a reflection signal of the high frequency signal inputted from the RF terminal P12.

Note that the directional coupler 10 may output, from the detection terminal P22, a high frequency signal (input measurement signal) excited by the high frequency signal inputted from the RF terminal P12, and may output, from the detection terminal P21, a high frequency signal (reflection measurement signal) excited by the reflection signal of the high frequency signal inputted from the RF terminal P12. That is, the directional coupler 10 does not depend on connection directions of external circuits with respect to the main line. Therefore, it is possible to achieve a highly convenient directional coupler.

Specifically, at the measurement time, a coupling output terminal or a terminator is connected to the detection terminal P21 and the detection terminal P22 when measuring the input measurement signal and the reflection measurement signal. The coupling output terminal is a terminal for outputting a signal for detection transmitting through the sub-line of the directional coupler 10 to an external circuit such as a detection circuit, and the terminator is a circuit configured to terminate a signal transmitting in the opposite direction with respect to the signal for detection transmitting through the sub-line of the directional coupler 10.

For example, when measuring an input measurement signal, the coupling output terminal is connected to the detection terminal P21, and the terminator is connected to the detection terminal P22. On the other hand, when measuring a reflection measurement signal, the coupling output terminal is connected to the detection terminal P22, and the terminator is connected to the detection terminal P21.

The terminator may be variable. In addition to the above-described constituent elements, an attenuator, a matching circuit, a filter, or the like may be connected between the sub-line and the coupling output terminal. The attenuator, the matching circuit, and the filter may have variable attenuation, variable impedance, and a variable pass band, respectively.

With respect to such circuit configuration, the directional coupler 10 is configured as described above, thereby making it possible to increase levels of the input measurement signal and the reflection measurement signal while suppressing the increase in size of the shape. Accordingly, the directional coupler 10 is able to more reliably output the input measurement signal and the reflection measurement signal than in the existing configuration.

Configuration of Electronic Component Module 1

As illustrated in FIGS. 1A and 2, an electronic component module 1 includes the directional coupler 10 and an IC 80. The directional coupler 10 has the above-described configuration.

The IC 80 functionally includes a circuit and the like configured to generate the above-described input measurement signal and reflection measurement signal from a high frequency signal propagating through the sub-line 131. For example, the IC 80 includes the above-described coupling output terminal, a variable terminator, and a switch circuit for switching the connection thereof. The IC 80 may not include all of them, and may include some of them.

The IC 80 is configured to include a main body 81 made of a semiconductor and the like, and a solder bump 82. The major circuits described above are formed in the main body 81. The IC 80 is mounted on the directional coupler 10. More specifically, the IC 80 is mounted on the second principal surface 112 of the substrate of the directional coupler 10 by joining the solder bump 82 to the land conductor 142.

The electronic component module 1 having the above-described configuration is mounted on a mother circuit substrate 90 where a high frequency signal to be detected is transmitted. More specifically, the external terminal conductor 141 disposed on the first principal surface 111 of the directional coupler 10 and a land conductor 900 of the mother circuit substrate 90 are joined to each other with a conductive bonding material such as solder.

In this configuration, the main line 121 is disposed closer to the mother circuit substrate 90 than the sub-line 131, and the connection distance between the main line 121 and the mother circuit substrate 90 is shortened. This makes it possible to shorten the transmission distance of the high frequency signal (high frequency signal to be detected) transmitting in the directional coupler 10, and decrease the insertion loss IL of the high frequency signal (high frequency signal to be detected) in the directional coupler 10.

Further, in this configuration, the sub-line 131 is disposed closer to the IC 80 than the main line 121, and the connection distance between the sub-line 131 and the IC 80 is shortened. This makes it possible to shorten the transmission distance of the high frequency signal excited in the sub-line 131 (the signal which is a source of the input measurement signal and the reflection measurement signal), and to decrease the insertion loss IL of the high frequency signal excited in the sub-line 131 (the signal which is the source of the input measurement signal and the reflection measurement signal) in the directional coupler 10.

In the above description, an aspect in which the main line 121 and the sub-line 131 completely overlap with each other in a width direction is indicated. However, the main line 121 and the sub-line 131 may take an aspect in which they partially overlap with each other in the width direction.

Further, in the above description, an aspect in which the main line 122 and the sub-line 131 are disposed at the same position in the thickness direction is indicated. However, the main line 122 and the sub-line 131 may take an aspect in which they are disposed at different positions in the thickness direction as long as they are electromagnetically coupled to each other.

Figure 4:
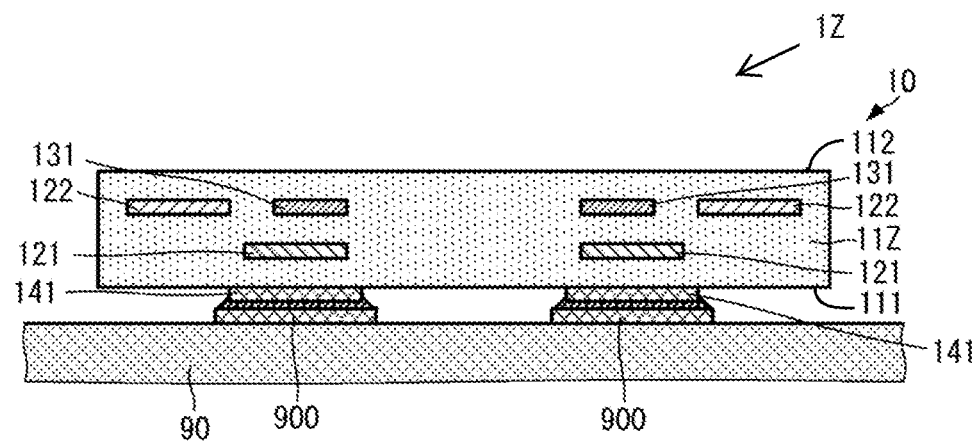
FIG. 4 is a schematic cross-sectional side view illustrating another aspect of a configuration of an electronic component module according to the first embodiment.

In a case where the directional coupler is formed in a semiconductor substrate, the IC 80 may be omitted. FIG. 4 is a schematic cross-sectional side view illustrating another aspect of the configuration of an electronic component module according to the first embodiment.

As illustrated in FIG. 4, in an electronic component module 1Z, only a substrate 11Z including the configuration of the conductor patterns of the above-described directional coupler 10 is mounted on the mother circuit substrate 90. Although not illustrated, the coupling output terminal, the variable terminator, the switch circuit for switching the connection thereof, and the like having been formed in the IC 80, are formed in the substrate 11Z instead.

Second Embodiment

Figure 5:
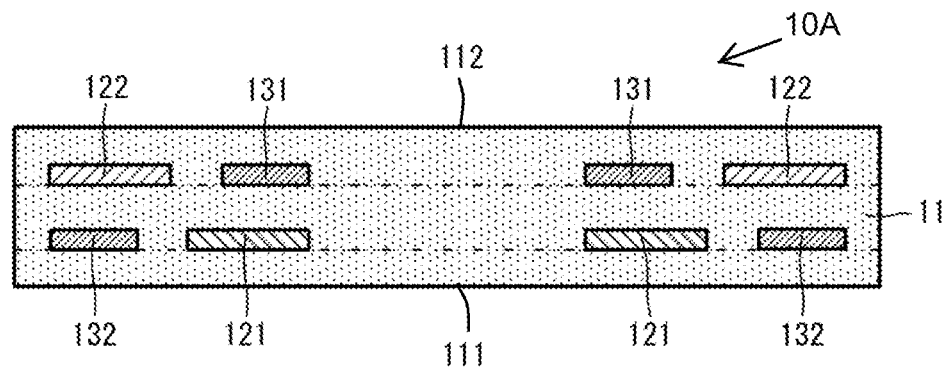
FIG. 5 is a schematic cross-sectional side view illustrating a configuration of a directional coupler according to a second embodiment.
Figure 6:
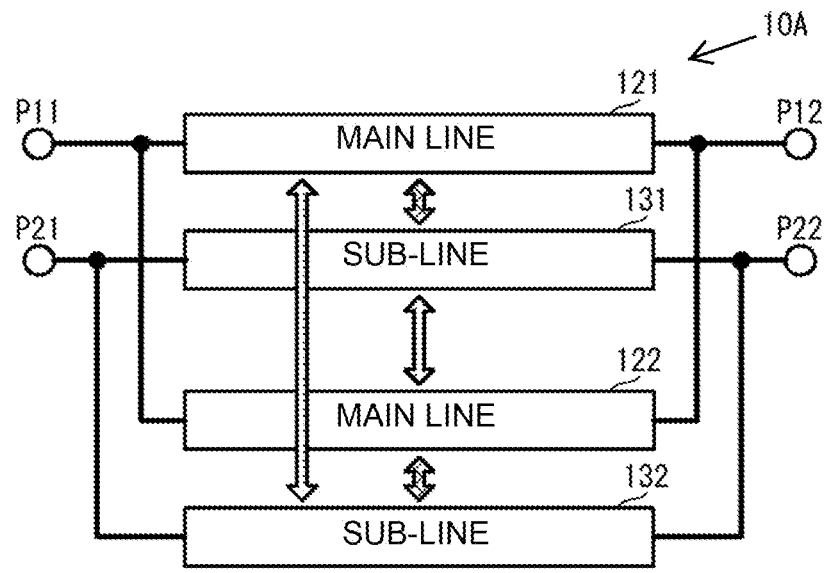
FIG. 6 is an equivalent circuit diagram of a directional coupler according to the second embodiment.

A directional coupler according to a second embodiment of the present disclosure will be described with reference to the drawings. FIG. 5 is a schematic cross-sectional side view illustrating a configuration of a directional coupler according to the second embodiment. FIG. 6 is an equivalent circuit diagram of a directional coupler according to the second embodiment.

As illustrated in FIGS. 5 and 6, a directional coupler 10A according to the second embodiment is different from the directional coupler 10 according to the first embodiment in a point that the sub-line 132 is added. Other constituent elements of the directional coupler 10A are similar to those of the directional coupler 10, and the description of similar portions will be omitted.

As illustrated in FIG. 5, the sub-line 132 is formed of a linear or strip-shaped conductor pattern, and is disposed in the substrate 11. The sub-line 132 overlaps with the main line 122 when the substrate 11 is seen in a plan view. The sub-line 132 is disposed at the same position as the main line 121 in a thickness direction of the substrate 11. The sub-line 132 corresponds to a "second sub-line" of the present disclosure.

The sub-line 132 is electromagnetically coupled to both the main line 122 and the main line 121.

As illustrated in FIG. 6, the sub-line 132 is connected in parallel to the sub-line 131.

With the above-described configuration, the directional coupler 10A includes a plurality of main lines and a plurality of sub-lines, and each of them is electromagnetically coupled to one another. As a result, electromagnetic field coupling between the main lines and the sub-lines becomes stronger in the directional coupler 10A as a whole. Accordingly, the directional coupler 10A may obtain a larger degree of coupling than that in the existing configuration while further suppressing the increase in size.

Note that, in the above-described description, an aspect is indicated in which the main line 122 and the sub-line 131 are disposed at the same position in the thickness direction, and the main line 121 and the sub-line 132 are disposed at the same position in the thickness direction. However, the main line 122 and the sub-line 131 may take an aspect in which they are disposed at different positions in the thickness direction as long as they are electromagnetically coupled to each other. Further, the main line 121 and the sub-line 132 may take an aspect in which they are disposed at different positions in the thickness direction as long as they are electromagnetically coupled to each other.

Figure 7:
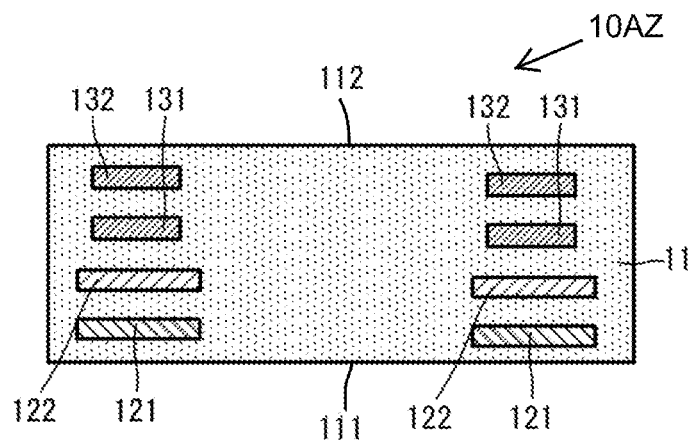
FIG. 7 is a schematic cross-sectional side view illustrating a configuration of another aspect of a directional coupler according to the second embodiment.

FIG. 7 is a schematic cross-sectional side view illustrating a configuration of another aspect of a directional coupler according to the second embodiment. For example, as illustrated in FIG. 7, in a directional coupler 10AZ, the main line 122 and the main line 121 may be disposed closer to the mother circuit substrate 90 than the sub-line 131 and the sub-line 132. Note that the positional relationship between the main line 122 and the main line 121 in FIG. 7 may be reversed, and similarly, a positional relationship between the sub-line 131 and the sub-line 132 may be reversed.

Third Embodiment

Figure 8:
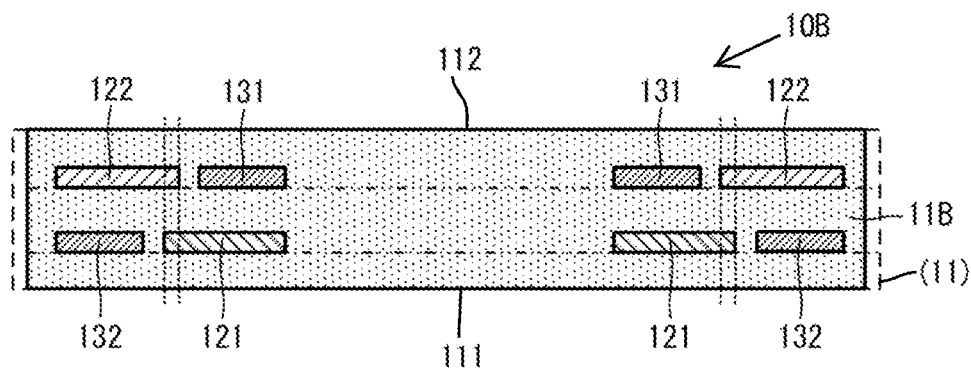
FIG. 8 is a schematic cross-sectional side view illustrating a configuration of a directional coupler according to a third embodiment.

A directional coupler according to a third embodiment of the present disclosure will be described with reference to the drawings. FIG. 8 is a schematic cross-sectional side view illustrating a configuration of the directional coupler according to the third embodiment.

As illustrated in FIG. 8, a directional coupler 10B according to the third embodiment is different from the directional coupler 10A according to the second embodiment in a positional relationship between a main line 121 and a main line 122. Other constituent elements of the directional coupler 10B are similar to those of the directional coupler 10A, and the description of similar portions will be omitted.

The main line 121 and the main line 122 partially overlap each other in a plan view of the substrate 11. More specifically, an end portion of the main line 121 on a side of the sub-line 132 and an end portion of the main line 122 on a side of the sub-line 131 overlap each other.

With this configuration, the directional coupler 10B is able to dispose the main line 122 and the sub-line 132 closer to the sub-line 131 side and the main line 121 side than the directional coupler 10A. Accordingly, as illustrated in FIG. 8, in a case where the size of a region on a side of a side surface of a substrate 11B relative to the main line 122 and the sub-line 132 is set to be the same as that of the substrate 11, the shape of the substrate 11B may be reduced. That is, the directional coupler 10B becomes smaller in size.

Fourth Embodiment

Figure 9:
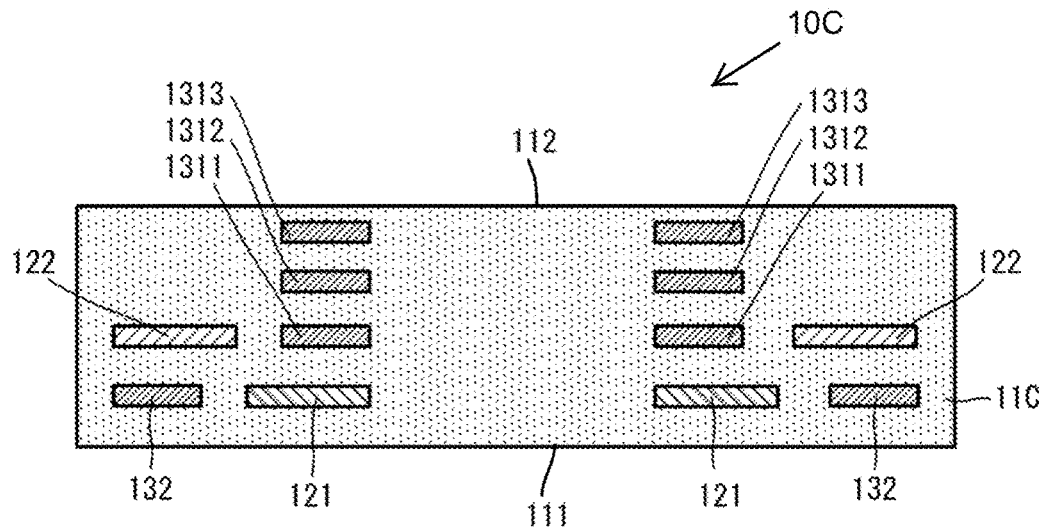
FIG. 9 is a schematic cross-sectional side view illustrating a configuration of a directional coupler according to a fourth embodiment.
Figure 10:
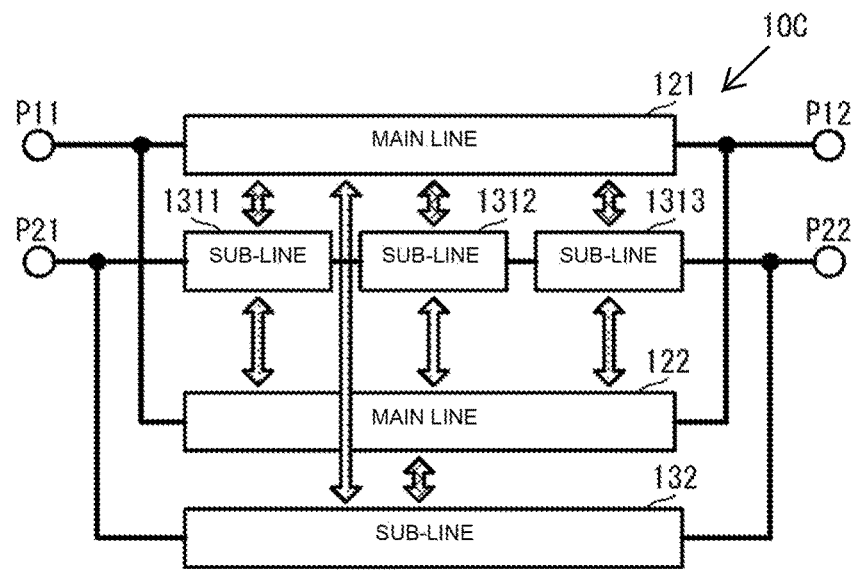
FIG. 10 is an equivalent circuit diagram of a directional coupler according to the fourth embodiment.

A directional coupler according to a fourth embodiment of the present disclosure will be described with reference to the drawings. FIG. 9 is a schematic cross-sectional side view illustrating a configuration of the directional coupler according to the fourth embodiment. FIG. 10 is an equivalent circuit diagram of the directional coupler according to the fourth embodiment.

As illustrated in FIGS. 9 and 10, a directional coupler 10C according to the fourth embodiment is different from the directional coupler 10A according to the second embodiment in a point that a sub-line 1311, a sub-line 1312, and a sub-line 1313 are added. Other constituent elements of the directional coupler 10C are similar to those of the directional coupler 10A, and the description of similar portions will be omitted.

As illustrated in FIG. 9, the directional coupler 10C includes a substrate 11C, the sub-line 1311, the sub-line 1312, and the sub-line 1313.

The sub-line 1311, sub-line 1312, and sub-line 1313 are each formed of a linear or strip-shaped conductor pattern, and are disposed in the substrate 11C. The sub-line 1311, sub-line 1312, and sub-line 1313 overlap with a main line 121 in a plan view of the substrate 11C.

The sub-line 1311, the sub-line 1312, and the sub-line 1313 are disposed at different positions in a thickness direction of the substrate 11C. More specifically, the sub-line 1311 is disposed at the same position as the main line 122 in the thickness direction of the substrate 11C. The sub-line 1312 is disposed closer to a second principal surface 112 side than the sub-line 1311, and the sub-line 1313 is disposed closer to the second principal surface 112 side than the sub-line 1312. It is preferable for each of the sub-line 1312 and sub-line 1313 to be disposed within a distance capable of obtaining electromagnetic field coupling with at least the main line 121, and to be disposed within a distance capable of obtaining the electromagnetic field coupling with the main line 122.

As illustrated in FIG. 10, the sub-line 1311, the sub-line 1312, and the sub-line 1313 are connected in series. This series circuit is connected in parallel to the sub-line 132.

In this configuration, the number of sub-lines that are electromagnetically coupled mainly to the main line 121 increases. This makes it possible for the directional coupler 10C to obtain stronger electromagnetic field coupling, and to obtain a larger degree of coupling.

Further, in this configuration, the directional coupler 10C is able to allow the frequencies of the excited high frequency signals to differentiate by, for example, causing the lengths of portions that contribute to the electromagnetic field couplings in the sub-line 1311, the sub-line 1312, and the sub-line 1313 to differentiate. This makes it possible for the directional coupler 10C to obtain a larger degree of coupling over a wide frequency band. That is, the directional coupler 10C is able to widen a frequency band in which a desired degree of coupling is obtained, and broaden the frequency characteristics.

In this configuration, the sub-line 1311, sub-line 1312, and sub-line 1313 are disposed on the same side with respect to the main line 121 in the thickness direction of the substrate 11C. This makes it easy to further increase the degree of coupling of the directional coupler 10C as a whole. Further, the sub-line 1311, the sub-line 1312, and the sub-line 1313 are disposed on the second principal surface 112 side with respect to the main line 121 in the thickness direction of the substrate 11C. As a result, a distance between each of the sub-line 1311, the sub-line 1312 and the sub-line 1313, and the land conductor on which the IC 80 is mounted (see the land conductor 142 in FIG. 1A) becomes shorter. This makes it possible for the directional coupler 10C to decrease insertion loss IL of a high frequency signal which is a source of an input measurement signal and a reflection measurement signal.

Fifth Embodiment

Figure 11:
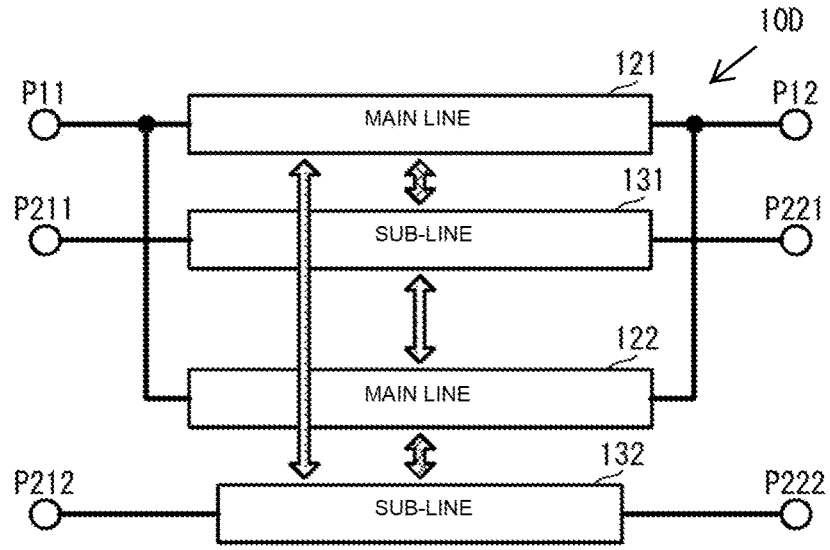
FIG. 11 is an equivalent circuit diagram of a directional coupler according to a fifth embodiment.

A directional coupler according to a fifth embodiment of the present disclosure will be described with reference to the drawings. FIG. 11 is an equivalent circuit diagram of the directional coupler according to the fifth embodiment.

As illustrated in FIG. 11, a directional coupler 10D according to the fifth embodiment is different from the directional coupler 10A according to the second embodiment in a connection mode between the sub-line 131 and the sub-line 132. Other constituent elements of the directional coupler 10D are similar to those of the directional coupler 10A, and the description of similar portions will be omitted.

The sub-line 131 and the sub-line 132 are not connected in parallel to each other. More specifically, the directional coupler 10D includes a detection terminal P211, a detection terminal P221, a detection terminal P212, and a detection terminal P222. The sub-line 131 is connected between the detection terminal P211 and the detection terminal P221. The sub-line 132 is connected between the detection terminal P212 and the detection terminal P222.

In this configuration, for example, a degree of coupling between the sub-line 131 and main lines 121 and 122 is different from the degree of coupling between the sub-line 132 and the main lines 121 and 122. The above-described situation may be achieved by, for example, causing a positional relationship of the sub-line 131 with respect to the main lines 121 and 122 to differentiate from a positional relationship of the sub-line 132 with respect to the main lines 121 and 122.

Accordingly, the directional coupler 10D is able to obtain input measurement signals and reflection measurement signals by a plurality of different kinds of coupling degrees.

In addition, in this configuration, a portion contributing to the electromagnetic field coupling of the sub-line 131 and a portion contributing to the electromagnetic field coupling of the sub-line 132 are different in length, for example. The above-described situation may be achieved by, for example, causing the length of a conductor pattern constituting the sub-line 131 to differentiate from a length of a conductor pattern constituting the sub-line 132.

With this, the directional coupler 10D is able to obtain the input measurement signals and the reflection measurement signals for high frequency signals of a plurality of different frequencies. Then, the directional coupler 10D is able to output the input measurement signals and the reflection measurement signals of the respective frequencies from the respective separate terminals.

Sixth Embodiment

Figure 12A:
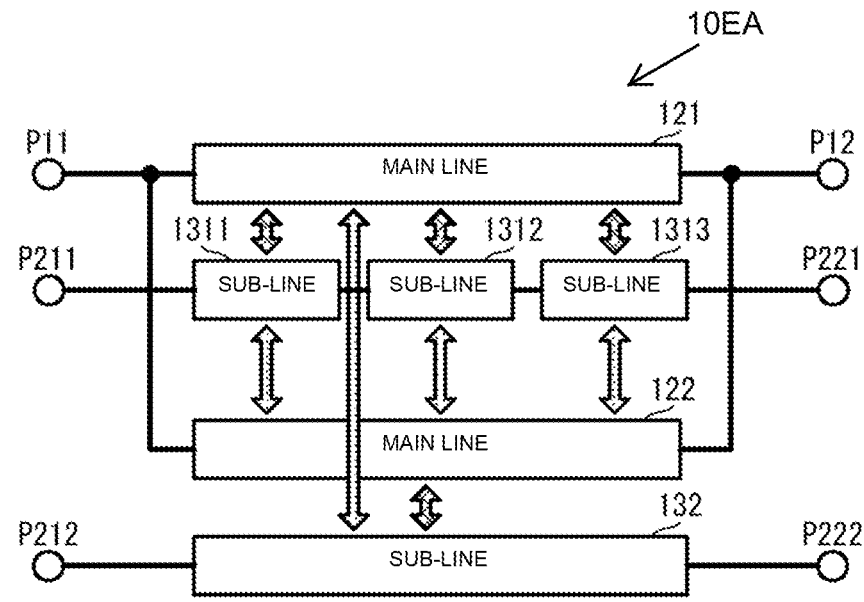
FIG. 12A is an equivalent circuit diagram of an example of a directional coupler according to a sixth embodiment.
Figure 12B:
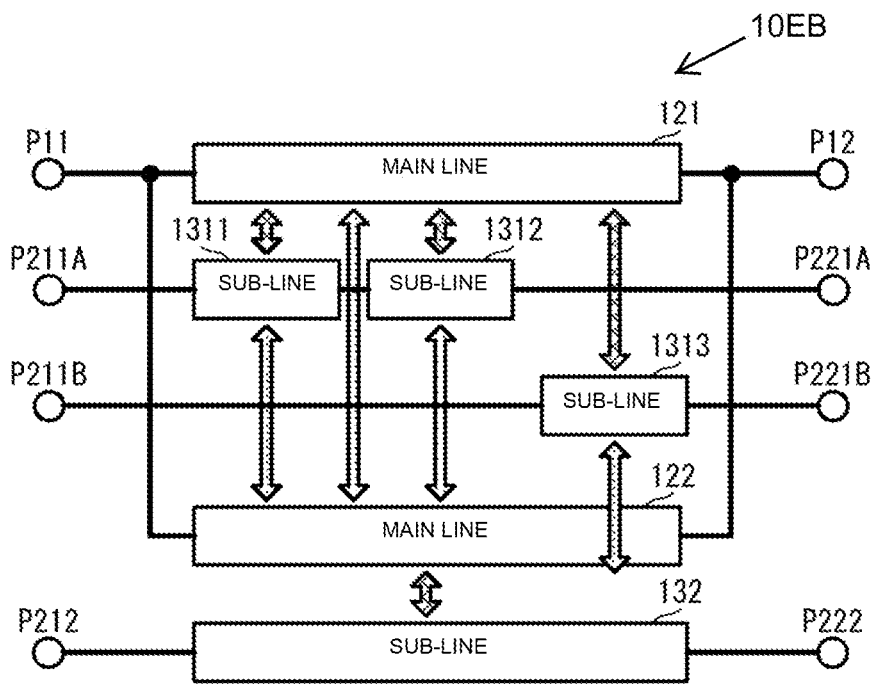
FIG. 12B is an equivalent circuit diagram of another example of a directional coupler according to the sixth embodiment.

A directional coupler according to a sixth embodiment of the present disclosure will be described with reference to the drawings. FIG. 12A is an equivalent circuit diagram of an example of the directional coupler according to the sixth embodiment, and FIG. 12B is an equivalent circuit diagram of another example of the directional coupler according to the sixth embodiment.

As illustrated in FIG. 12A, a directional coupler 10EA according to the sixth embodiment has a configuration combining the configurations of the directional coupler 10C according to the fourth embodiment and the directional coupler 10D according to the fifth embodiment. Except for the combined portion, constituent elements of the directional coupler 10EA are similar to those of the directional coupler 10C or 10D, and the description of similar portions will be omitted.

More specifically, the present embodiment has a configuration in which the sub-line 131 in the directional coupler 10D according to the fifth embodiment is replaced with the series circuit of the sub-line 1311, the sub-line 1312, and the sub-line 1313 in the directional coupler 10C according to the fourth embodiment. That is, the sub-line 1311, the sub-line 1312, and the sub-line 1313 are connected in series between the detection terminal P211 and the detection terminal P221.

With this configuration, the directional coupler 10EA is able to exhibit an action effect of the directional coupler 10C and an action effect of the directional coupler 10D.

As illustrated in FIG. 12B, a directional coupler 10EB according to the sixth embodiment is different from the directional coupler 10EA illustrated in FIG. 12A in a connection configuration of a sub-line 1311, the sub-line 1312, and the sub-line 1313. Except for this connection configuration, constituent elements of the directional coupler 10EB are similar to those of the directional coupler 10EA, and the description of similar portions will be omitted.

The sub-line 1311 and the sub-line 1312 are connected in series between a detection terminal P211A and a detection terminal P221A. The sub-line 1313 is connected between a detection terminal P211B and a detection terminal P221B.

Even in such configuration, the directional coupler 10EB is able to exhibit the same action effect as that of the directional coupler 10EA described above. The directional coupler 10EB is able to further support various coupling degrees and frequencies.

Note that, in the directional coupler 10EB, the sub-line 1311 and the sub-line 1312 are connected in series to each other. However, it is also possible to cause the detection terminals to which the sub-line 1311 is connected and the detection terminals to which the sub-line 1312 is connected to differentiate.

The directional couplers illustrated in FIGS. 12A and 12B may each further include a switch capable of selecting one sub-line or more from among the plurality of sub-lines. By switching, for example, a length of the sub-line by using the switch, an appropriate degree of coupling is obtained over a wide frequency band.

Seventh Embodiment

Figure 13:
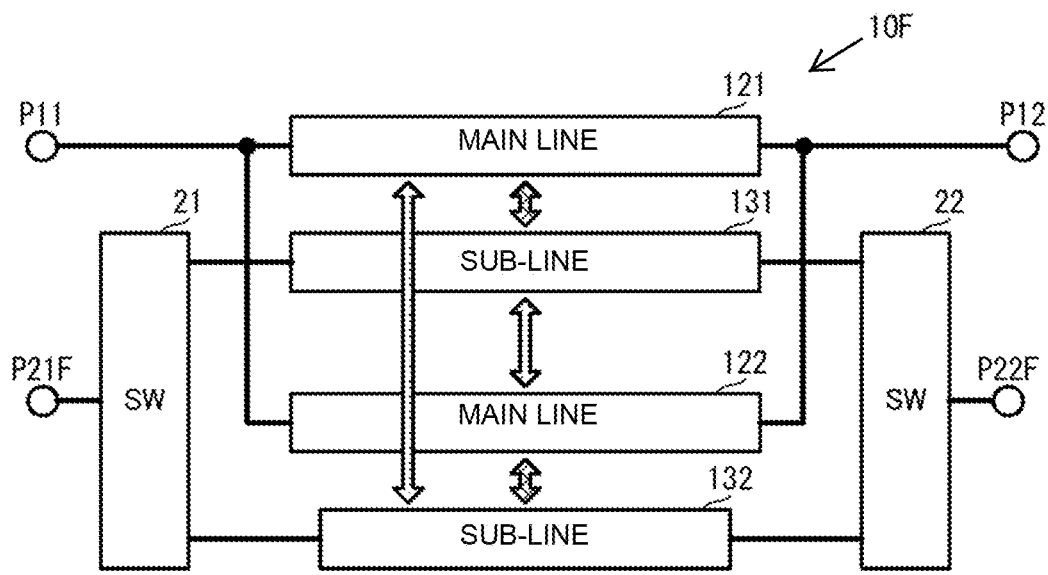
FIG. 13 is an equivalent circuit diagram of a directional coupler according to a seventh embodiment.

A directional coupler according to a seventh embodiment of the present disclosure will be described with reference to the drawings. FIG. 13 is an equivalent circuit diagram of the directional coupler according to the seventh embodiment.

As illustrated in FIG. 13, a directional coupler 10F according to the seventh embodiment is different from the directional coupler 10A according to the second embodiment in a point that a switch circuit 21 and a switch circuit 22 are added. Other constituent elements of the directional coupler 10F are similar to those of the directional coupler 10A, and the description of similar portions will be omitted.

The directional coupler 10F includes the switch circuit 21 and the switch circuit 22. The switch circuit 21 selectively connects the sub-line 131 or the sub-line 132 to a detection terminal P21F. The switch circuit 22 selectively connects the sub-line 131 or the sub-line 132 to a detection terminal P22F. When the switch circuit 21 connects the detection terminal P21F and the sub-line 131, the switch circuit 22 connects the detection terminal P22F and the sub-line 131. When the switch circuit 21 connects the detection terminal P21F and the sub-line 132, the switch circuit 22 connects the detection terminal P22F and the sub-line 132.

The switch circuit 21 and the switch circuit 22 are formed, for example, in the IC 80.

With the above-described configuration, the directional coupler 10F is able to switch to/from an output by the sub-line 131 from/to an output by the sub-line 132. With this, for example, when a length of the sub-line 131 is different from a length of the sub-line 132, the directional coupler 10F is able to selectively output the input measurement signals and reflection measurement signals for a plurality of kinds of high frequency signals having different frequencies.

Note that, in the directional coupler 10F, it is possible for the switch circuit 21 to connect the detection terminal P21F to both the sub-line 131 and the sub-line 132, and it is possible for the switch circuit 22 to connect the detection terminal P22F to both the sub-line 131 and the sub-line 132.

Eighth Embodiment

Figure 14:
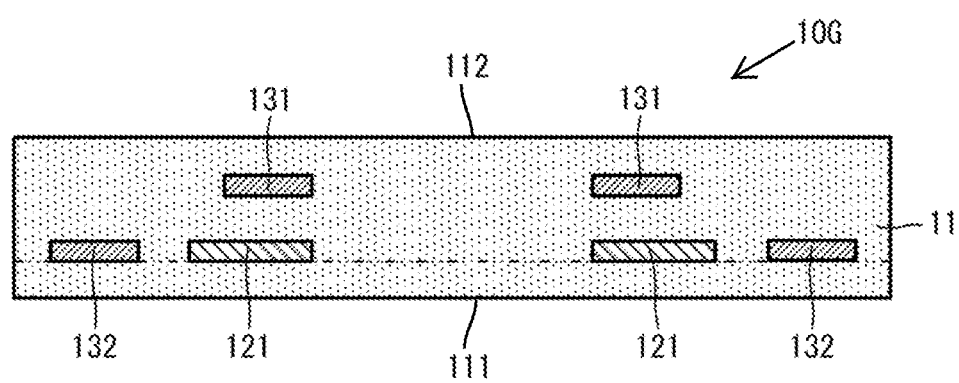
FIG. 14 is a schematic cross-sectional side view illustrating a configuration of a directional coupler according to an eighth embodiment.
Figure 15:
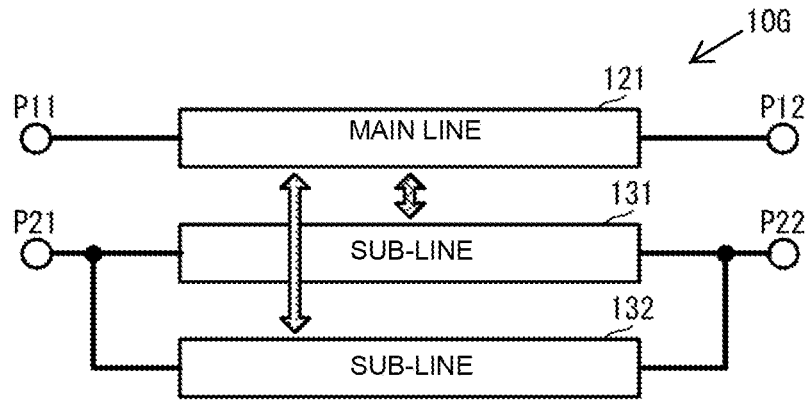
FIG. 15 is an equivalent circuit diagram of a directional coupler according to the eighth embodiment.

A directional coupler according to an eighth embodiment of the present disclosure will be described with reference to the drawings. FIG. 14 is a schematic cross-sectional side view illustrating a configuration of the directional coupler according to the eighth embodiment. FIG. 15 is an equivalent circuit diagram of the directional coupler according to the eighth embodiment.

As illustrated in FIGS. 14 and 15, a directional coupler 10G according to the eighth embodiment is different from the directional coupler 10 according to the first embodiment in a point that the number of main lines and the number of sub-lines are interchanged. Other constituent elements of the directional coupler 10G are similar to those of the directional coupler 10, and the description of similar portions will be omitted.

The directional coupler 10G includes the main line 121, the sub-line 131, and the sub-line 132. The main line 121 and the sub-line 131 overlap with each other in a plan view of the substrate 11. The main line 121 and the sub-line 132 are disposed at the same position in a thickness direction of the substrate 11. The sub-line 131 and the sub-line 132 are connected in parallel to each other.

Even with this configuration, the directional coupler 10G is able to exhibit the same effect as that of the directional coupler 10.

Note that the number of main lines and the number of sub-lines are not limited to those described above, and the number of main lines and the number of sub-lines may be appropriately set within a range applied to the concept of each embodiment.

The configurations represented in the above-described embodiments may be combined as appropriate. Then, it is possible to exhibit an action effect in accordance with each combination.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A directional coupler comprising:
   a substrate having a first principal surface and a second principal surface opposing each other;
   a first main line and a second main line each including a conductor pattern provided in or on the substrate, and connected in parallel to each other; and
   a first sub-line including a conductor pattern provided in or on the substrate,
   wherein the first sub-line is disposed at a position at least partially overlapping with the first main line in a plan view when seen in a thickness direction orthogonal to the first principal surface and the second principal surface,
   the first principal surface is a connection surface to another substrate to which a high frequency signal detected by the directional coupler is transmitted, and
   the first main line is disposed closer to a side of the first principal surface than the first sub-line.

2. The directional coupler according to claim 1,
   wherein the second main line and the first sub-line are disposed at an identical position in the thickness direction.

3. The directional coupler according to claim 2,
   wherein the first principal surface is a connection surface to another substrate to which a high frequency signal detected by the directional coupler is transmitted, and
   the first main line is disposed closer to a side of the first principal surface than the first sub-line.

4. The directional coupler according to claim 2,
   wherein the first main line and the second main line are disposed at different positions in the plan view.

5. The directional coupler according to claim 2,
   wherein at least a part of the first main line and at least a part of the second main line overlap with each other in the plan view.

6. The directional coupler according to claim 2, further comprising:
   a second sub-line comprised of a conductor pattern provided in or on the substrate,
   wherein the second sub-line is disposed at a position different from the position of the first sub-line in the thickness direction.

7. The directional coupler according to claim 1,
   wherein the first main line and the second main line are disposed at different positions in the plan view.

8. The directional coupler according to claim 7,
   wherein at least a part of the first main line and at least a part of the second main line overlap with each other in the plan view.

9. The directional coupler according to claim 1,
   wherein at least a part of the first main line and at least a part of the second main line overlap with each other in the plan view.

10. The directional coupler according to claim 9, wherein at least a part of the first sub-line is electromagnetically coupled to the first main line and the second main line in the plan view.

11. The directional coupler according to claim 1, further comprising:
a second sub-line comprised of a conductor pattern provided in or on the substrate,
wherein the second sub-line is disposed at a position different from the position of the first sub-line in the thickness direction.

12. The directional coupler according to claim 11, wherein at least a part of the second sub-line is disposed at a position overlapping at least a part of the second main line in the plan view.

13. The directional coupler according to claim 12, wherein, in the thickness direction, the first main line and the second sub-line are disposed at an identical position in the thickness direction.

14. The directional coupler according to claim 11, wherein the first sub-line and the second sub-line are connected in parallel to each other.

15. The directional coupler according to claim 1, wherein the first sub-line is comprised of a plurality of conductor patterns disposed at a plurality of different positions in the thickness direction.

16. A directional coupler comprising:
a substrate having a first principal surface and a second principal surface opposing each other;
a main line comprised of a conductor pattern provided in or on the substrate; and
a first sub-line and a second sub-line each comprised of a conductor pattern provided in or on the substrate, and connected in parallel to each other,
wherein the main line is disposed at a position at least partially overlapping with the first sub-line or the second sub-line in a plan view when seen in a thickness direction orthogonal to the first principal surface and the second principal surface,
the first principal surface is a connection surface to another substrate to which a high frequency signal detected by the directional coupler is transmitted, and
the first main line is disposed closer to a side of the first principal surface than the first sub-line.

17. An electronic component module comprising:
the directional coupler according to claim 1; and
an integrated circuit mounted on the second principal surface and including a circuit connected to the first sub-line and configured to generate a measurement signal from a high frequency signal flowing through the first sub-line.

\* \* \* \* \*